(12) United States Patent
Lee et al.

(10) Patent No.: US 11,834,738 B2
(45) Date of Patent: Dec. 5, 2023

(54) SPUTTERING APPARATUS AND METHOD OF FABRICATING MAGNETIC MEMORY DEVICE USING THE SAME

(71) Applicant: Samsung Electronics Co., Ltd., Suwon-si (KR)

(72) Inventors: Joonmyoung Lee, Gwacheon-si (KR); Whankyun Kim, Seoul (KR); Eunsun Noh, Yongin-si (KR); Jeong-heon Park, Hwaseong-si (KR); Junho Jeong, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/956,281

(22) Filed: Sep. 29, 2022

(65) Prior Publication Data

US 2023/0013146 A1 Jan. 19, 2023

Related U.S. Application Data

(63) Continuation of application No. 16/856,539, filed on Apr. 23, 2020, now Pat. No. 11,535,930.

(30) Foreign Application Priority Data

Sep. 16, 2019 (KR) .................. 10-2019-0113431

(51) Int. Cl.
*C23C 14/54* (2006.01)
*C23C 14/00* (2006.01)
(Continued)

(52) U.S. Cl.
CPC ........ *C23C 14/541* (2013.01); *C23C 14/0057* (2013.01); *G11B 5/851* (2013.01); *H10B 61/00* (2023.02); *H10N 50/01* (2023.02)

(58) Field of Classification Search
CPC ... C23C 14/0057; C23C 14/08; C23C 14/165; C23C 14/3464; C23C 14/541; G11B 5/851; H01L 27/222; H01L 27/228; H01L 43/12
See application file for complete search history.

(56) References Cited

U.S. PATENT DOCUMENTS 6,541,371 B1 * 4/2003 Ashtiani ............. H01L 21/2855
438/653
9,097,754 B2 8/2015 Satake et al.
(Continued)

FOREIGN PATENT DOCUMENTS

KR 10-2017-0090346 A 8/2017

*Primary Examiner* — Jaehwan Oh
(74) *Attorney, Agent, or Firm* — Harness, Dickey & Pierce, P.L.C.

(57) ABSTRACT

A sputtering apparatus including a chamber, a gas supply configured to supply the chamber with a first gas and a second inert gas, the first inert gas and the second inert gas having a first evaporation point and second evaporation point, respectively, a plurality of sputter guns in an upper portion of the chamber, a chuck in a lower portion of the chamber and facing the sputter guns, the chuck configured to accommodate a substrate thereon, and a cooling unit connected to a lower portion of the chuck, the cooling unit configured to cool the chuck to a temperature less than the first evaporation point and greater than the second evaporation point, and a method of fabricating a magnetic memory device may be provided.

7 Claims, 14 Drawing Sheets

(51) Int. Cl.
*G11B 5/851* (2006.01)
*H10B 61/00* (2023.01)
*H10N 50/01* (2023.01)

(56) References Cited

U.S. PATENT DOCUMENTS

| | | | |
|---|---|---|---|
| 9,466,499 B2* | 10/2016 | Van Duren | C23C 14/34 |
| 9,752,226 B2 | 9/2017 | Tsunekawa | |
| 9,856,557 B1* | 1/2018 | Yi | C23C 14/541 |
| 10,147,873 B2 | 12/2018 | Lee et al. | |
| 10,283,701 B1 | 5/2019 | Ikhtiar et al. | |
| 10,439,131 B2* | 10/2019 | Siddik | G11C 11/161 |
| 2005/0110004 A1* | 5/2005 | Parkin | H01F 41/307 |
| | | | 257/30 |
| 2009/0050468 A1* | 2/2009 | Allen | C23C 14/185 |
| | | | 204/192.1 |
| 2012/0193216 A1* | 8/2012 | Endo | H01J 37/34 |
| | | | 204/192.1 |
| 2012/0285819 A1* | 11/2012 | Child | C23C 14/3464 |
| | | | 204/192.12 |
| 2013/0101749 A1* | 4/2013 | Yang | H01J 37/3405 |
| | | | 427/523 |
| 2013/0186338 A1* | 7/2013 | Tsai | H01L 21/324 |
| | | | 118/725 |
| 2014/0105709 A1* | 4/2014 | Abarra | H01L 21/68785 |
| | | | 414/222.01 |
| 2014/0256129 A1* | 9/2014 | Lai | C23C 14/564 |
| | | | 118/725 |
| 2014/0273340 A1* | 9/2014 | Van Duren | H01L 27/1225 |
| | | | 438/104 |
| 2015/0176117 A1* | 6/2015 | Fong | C23C 14/5833 |
| | | | 204/298.04 |
| 2015/0338362 A1* | 11/2015 | Adhiprakasha | C23C 14/06 |
| | | | 506/12 |
| 2016/0035376 A1* | 2/2016 | He | G11B 5/3906 |
| | | | 427/129 |
| 2016/0071707 A1* | 3/2016 | Furukawa | H01J 37/32733 |
| | | | 204/298.09 |
| 2016/0093711 A1* | 3/2016 | Hong | H01L 21/28185 |
| | | | 257/407 |
| 2016/0211440 A1* | 7/2016 | Siddik | H10N 50/01 |
| 2016/0260589 A1* | 9/2016 | Suzuki | C23C 14/352 |
| 2017/0034965 A1* | 2/2017 | Park | C22C 45/001 |
| 2017/0222133 A1 | 8/2017 | Lim et al. | |
| 2018/0073131 A1* | 3/2018 | Lee | H01J 37/32724 |
| 2018/0331280 A1 | 11/2018 | Hosoya et al. | |
| 2019/0355900 A1 | 11/2019 | Kim et al. | |
| 2020/0093027 A1* | 3/2020 | Abarra | H01L 21/68792 |

* cited by examiner

SPUTTERING APPARATUS AND METHOD OF FABRICATING MAGNETIC MEMORY DEVICE USING THE SAME

CROSS-REFERENCE TO RELATED APPLICATION

This U.S. nonprovisional application is a divisional of U.S. application Ser. No. 16/856,539, filed on Apr. 23, 2020, which claims priority under 35 U.S.C § 119 to Korean Patent Application No. 10-2019-0113431 filed on Sep. 16, 2019, in the Korean Intellectual Property Office, the disclosures of each of which are hereby incorporated by reference in their entirety.

BACKGROUND

The present inventive concepts relate to apparatuses for and/or methods of fabricating a semiconductor device using the same, and more particularly, to sputtering apparatuses and/or methods of fabricating a magnetic memory device using the same.

As electronic products trend toward higher speed and/or lower power consumption, high speed and low operating voltages are increasingly desired for semiconductor memory devices incorporated in the electronic products. In order to meet such requirements, magnetic memory devices have been developed as semiconductor memory devices. Because magnetic memory devices operate at relatively high speeds and have nonvolatile characteristics, they have attracted considerable attention as the next-generation semiconductor memory devices.

SUMMARY

Some example embodiments of the present inventive concepts provide sputtering apparatuses capable of reducing surface roughness and increasing perpendicular magnetic anisotropy of a magnetic metal layer and/or methods of fabricating a magnetic memory device using the same.

According to some example embodiments of the present inventive concepts, a sputtering apparatus may include a chamber, a gas supply configured to supply the chamber with a first gas and a second inert gas, the first inert gas and the second inert gas having a first evaporation point and second evaporation point, respectively, a plurality of sputter guns in an upper portion of the chamber, a chuck in a lower portion of the chamber and facing the sputter guns, the chuck configured to accommodate a substrate thereon, and a cooling unit connected to a lower portion of the chuck, the cooling unit configured to cool the chuck to a temperature less than the first evaporation point and greater than the second evaporation point.

According to some example embodiments of the present inventive concepts, a sputtering apparatus may include a chamber, a chuck in a lower portion of the chamber and loads a substrate, a cooling unit connected to a lower portion of the chuck, the cooling unit configured to cool the chuck to a temperature less than room temperature, a gas supply configured to supply the chamber with an inert gas, and a plurality of sputter guns above the chuck and in an upper portion of the chamber. The sputter guns may include, a first sputter gun on one side of the chuck, and a second sputter gun on another side of the chuck, the second sputter gun having a nozzle hole configured to spray the inert gas.

According to some example embodiments of the present inventive concepts, a method of fabricating a magnetic memory device may include forming a first magnetic metal layer on a substrate, forming a non-magnetic metal oxide layer on the first magnetic metal layer using a first sputtering process to keep the substrate at or above a room temperature, and forming a second magnetic metal layer on the non-magnetic metal oxide layer using a second sputtering process to cool the substrate to a temperature of 50K or less.

DETAILED DESCRIPTION

While the term "same" "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Further, regardless of whether numerical values are modified as "about" or "substantially," it will be understood that these values should be construed as including a manufacturing or operational tolerance (e.g., ±10%) around the stated numerical values or shapes.

Figure 1:
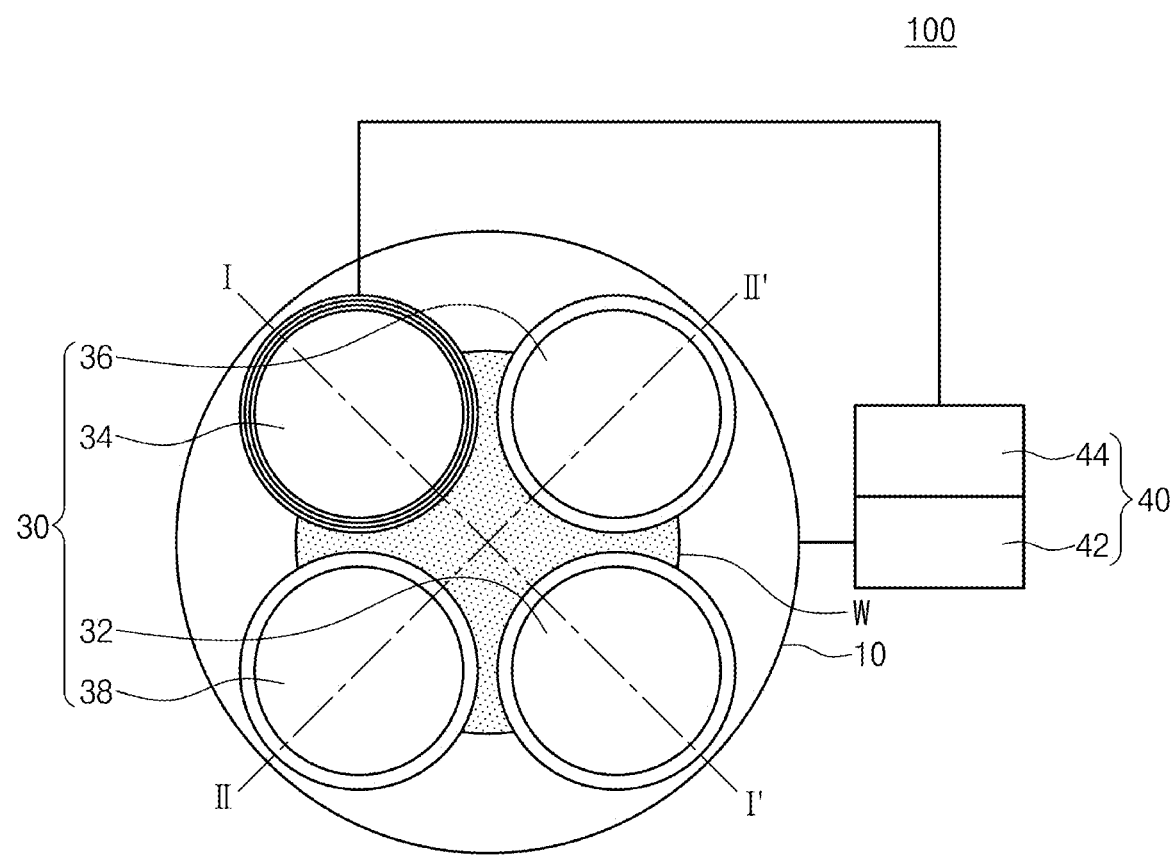
FIG. 1 illustrates a plan view showing an example of a sputtering apparatus according to an example embodiment of the present inventive concepts.
Figure 2:
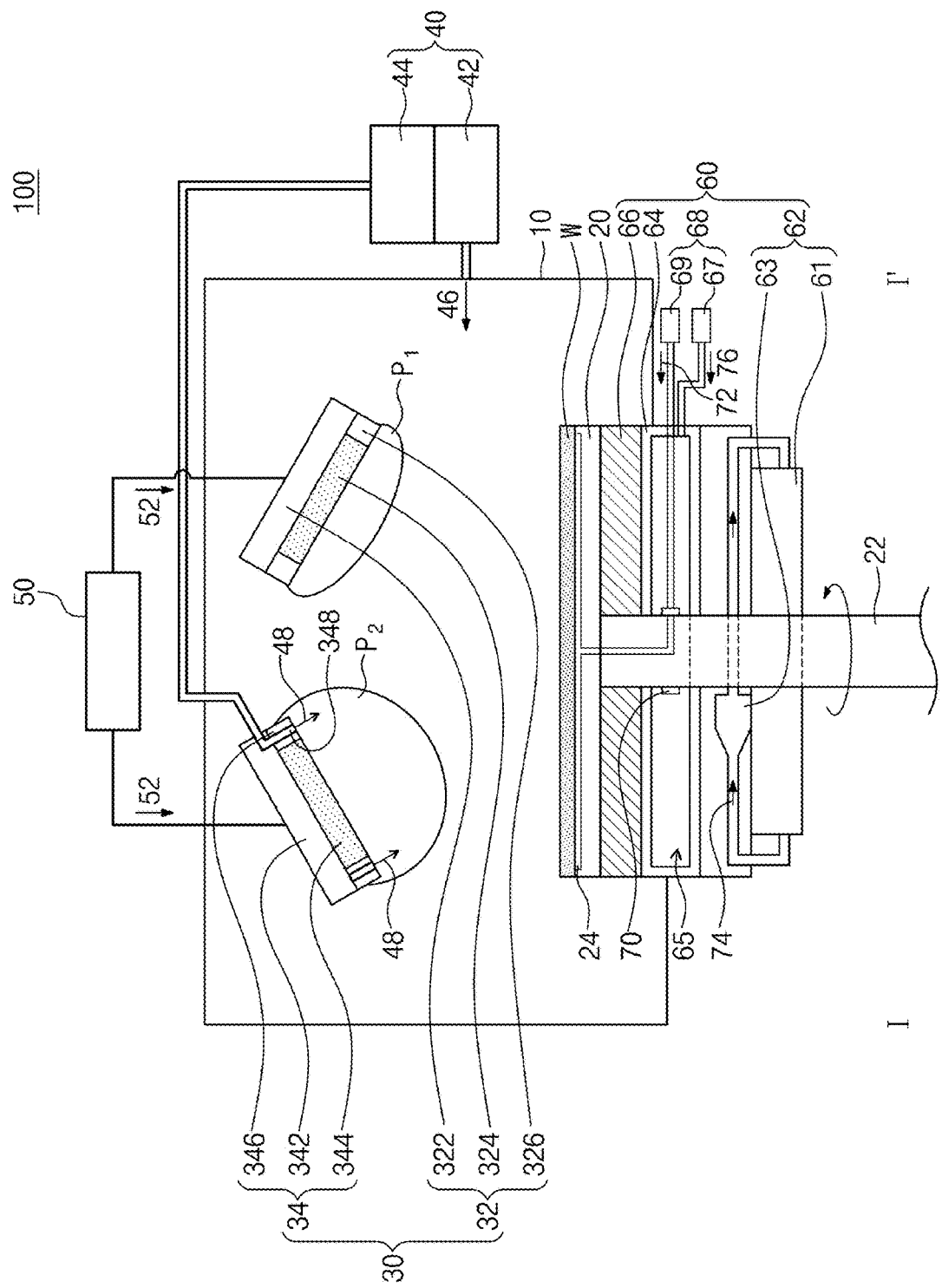
FIG. 2 illustrates a cross-sectional view taken along line I-I' of FIG. 1.

FIG. 1 shows an example of a sputtering apparatus 100 according to an example embodiment of the present inventive concepts. FIG. 2 shows a cross-sectional view taken along line I-I' of FIG. 1.

Referring to FIGS. 1 and 2, the sputtering apparatus 100 according to an example embodiment of the present inventive concepts may include a chamber 10, a chuck 20, sputter guns 30, a gas supply 40, a power supply 50, and a cooling unit 60.

The chamber 10 may provide a hermetic space for accommodating a substrate W therein. For example, the chamber 10 may be pumped out to a high-vacuum pressure of about $1\times10^{-6}$ Torr. When the chamber 10 is provided with a first inert gas 46 or a second inert gas 48, the chamber 10 may have a low-vacuum pressure of $1\times10^{-3}$ Torr to about $1\times10^{-4}$ Torr. Although not shown, the chamber 10 may be provided in plural, and the plurality of chambers 10 may be connected in cluster type.

The chuck 20 may be disposed in a lower portion of the chamber 10. The chuck 20 may load the substrate W. The chuck 20 may use a voltage to electrostatically clamp or accommodate the substrate W thereon. A driving mechanism 22 may provide the chuck 20 with a rotational force to rotate the chuck 20 having the substrate W thereon. The driving mechanism 22 may support the chuck 20. The driving mechanism 22 may include a shaft. The chuck 20 may have a coolant hole 24. The coolant hole 24 may be disposed on a top side of the chuck 20 and adjacent to a bottom surface of the substrate W. The chuck 20 may use a first coolant 72 in the coolant hole 24, such that the substrate W may be cooled. The first coolant 72 may include a helium (He) gas.

The sputter guns 30 may be disposed above the chuck 20 and in an upper portion of the chamber 10. The sputter guns 30 may generate sources for thin layers, for example, metal layers and/or metal oxide layers. For example, the sputter guns 30 may include first, second, third, and fourth sputter guns 32, 34, 36, and 38.

The first sputter gun 32 may be disposed on one side of the chuck 20. The first sputter gun 32 may use the first inert gas 46 and a radio-frequency power 52 to form a first non-magnetic metal layer (see 106 of FIG. 6) on the substrate W. For example, the first sputter gun 32 may include a first cathode 322, a first target 324, and a first shield 326. The first cathode 322 may use the radio-frequency power 52 to cause the first inert gas 46 to generate first plasma P1 on the first target 324. Further, the first cathode 322 may force positive ions of the first inert gas 46 in the first plasma P1 to collide against the first target 324 to produce a source for the first non-magnetic metal layer 106. The first target 324 may be disposed on the first cathode 322. The first target 324 may include a non-magnetic rare earth metal. For example, the first target 324 may include ruthenium (Ru). The first shield 326 may surround the first target 324 and may protect a sidewall of the first target 324 from the first plasma P1. The first shield 326 may include a ceramic (e.g., $Al_2O_3$ or $Y_2O_3$).

The second sputter gun 34 may be disposed on another side of the chuck 20. The second sputter gun 34 may use the second inert gas 48 and the radio-frequency power 52 to form a first magnetic metal layer (see 110 of FIG. 7) and a second magnetic metal layer (see 130 of FIG. 9) on the substrate W. For example, the second sputter gun 34 may include a second cathode 342, a second target 344, and a second shield 346. The second cathode 342 may use the radio-frequency power 52 to cause the second inert gas 48 to generate second plasma P2 on the second target 344. Further, the second cathode 342 may force positive ions of the second inert gas 48 in the second plasma P2 to collide against the second target 344 to produce a source for the first magnetic metal layer 110 and a second magnetic metal layer 130. The second target 344 may be disposed on the second cathode 342. For example, the second target 344 may include a magnetic metal (e.g., nickel (Ni), cobalt (Co), or iron (Fe)). The second shield 346 may be disposed on an edge of the second cathode 342 outside the second target 344. The second shield 346 may protect a sidewall of the second target 344 from the second plasma P2. The second shield 346 may include a ceramic (e.g., $Al_2O_3$ or $Y_2O_3$). The second shield 346 may have a nozzle hole 348. The nozzle hole 348 may be connected to a second gas supply 44 which will be discussed below. The second target 344 may be provided in the vicinity thereof with the second inert gas 48 from the nozzle hole 348, and thus the second plasma P2 may be induced. The second plasma P2 may have a size greater than that of the first plasma P1. The second plasma P2 may have a density greater than that of the first plasma P1.

Figure 3:
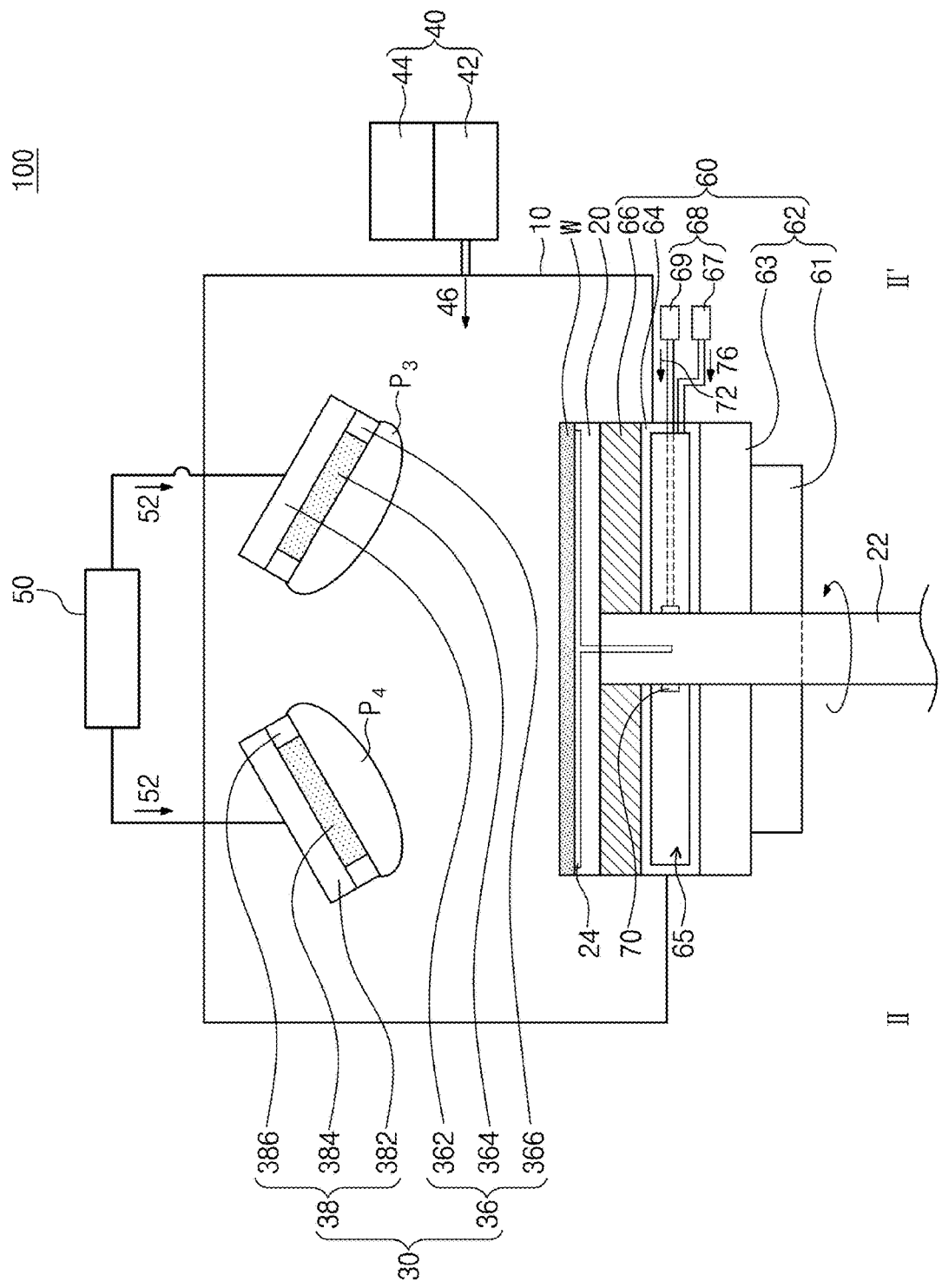
FIG. 3 illustrates a cross-sectional view taken along line II-II' of FIG. 1.

FIG. 3 shows a cross-sectional view taken along line II-II′ of FIG. 1.

Referring to FIG. 3, the third sputter gun 36 may be disposed on one side in the upper portion of the chamber 10. The third sputter gun 36 may use the first inert gas 46 and the radio-frequency power 52 to form a non-magnetic metal oxide layer (see 120 of FIG. 8) on the substrate W. For example, the third sputter gun 36 may include a third cathode 362, a third target 364, and a third shield 366. The third cathode 362 may use the radio-frequency power 52 to generate third plasma P3 of the first inert gas 46. The third plasma P3 may be different from the first plasma P1. The third cathode 362 may force positive ions in the third plasma P3 to collide against the third target 364 to produce a source for the non-magnetic metal oxide layer 120. The third target 364 may be disposed on the third cathode 362. The third target 364 may include magnesium oxide (MgO). The third shield 366 may be disposed on an edge of the third cathode 362 outside the third target 364. The third shield 366 may protect a sidewall of the third target 364 from the third plasma P3. The third shield 366 may include a ceramic (e.g., $Al_2O_3$ or $Y_2O_3$).

The fourth sputter gun 38 may be disposed on another side in the upper portion of the chamber 10. The fourth sputter gun 38 may use the first inert gas 46 and the radio-frequency power 52 to form a second non-magnetic metal layer (see 140 of FIG. 10) on the substrate W. For example, the fourth sputter gun 38 may include a fourth cathode 382, a fourth target 384, and a fourth shield 386. The fourth cathode 382 may use the radio-frequency power 52 to generate fourth plasma P4 of the first inert gas 46. The fourth plasma P4 may be the same as the first plasma P1 and the third plasma P3. The fourth target 384 may be disposed on the fourth cathode 382. The fourth target 384 may be or include a source of the second non-magnetic metal layer 140. For example, the fourth target 384 may include a metal (e.g., tungsten (W), aluminum (Al), gold (Au), or silver (Ag)). The fourth shield 386 may surround the fourth target 384 and may protect a sidewall of the fourth target 384 from the fourth plasma P4.

Referring back to FIG. 2, the gas supply 40 may supply the chamber 10 with one or more of the first inert gas 46 and the second inert gas 48. The first inert gas 46 and the second inert gas 48 may be supplied at the same time, or at different times. For example, the first inert gas 46 and the second inert gas 48 may be selectively supplied based on temperatures of the chuck 20 and the substrate W. When the chuck 20 and the substrate W are at a room temperature or a higher temperature greater than room temperature, the first inert gas 46 may be supplied to the chamber 10. When the chuck 20 and the substrate W are cooled by the cooling unit 60, the second inert gas 48 may be supplied to the chamber 10. The gas supply 40 may include a first gas supply 42 and a second gas supply 44.

The first gas supply 42 may be connected to an inner wall of the chamber 10. The first gas supply 42 may supply the first inert gas 46 to the chamber 10. The first inert gas 46 may include, for example, an argon (Ar) gas. The first inert gas 46 may have an evaporation point of about 87.3 K. For example, the first gas supply 42 may supply the first inert gas 46 at flow rates between about 30 sccm and about 50 sccm.

The second gas supply 44 may be connected to the nozzle hole 348 in the second shield 346. The second gas supply 44 may provide the second inert gas 48 to the nozzle hole 348. The second inert gas 48 may have an atomic weight less than that of the first inert gas 46. The second inert gas 48 may include, for example, a neon (Ne) gas. The second inert gas 48 may have an evaporation point of about 27.7 K or less. The chamber 10 may be supplied with the second inert gas 48 at a flow rate greater than that at which the first inert gas 46 is supplied to the chamber 10. For example, the second gas supply 44 may provide the second inert gas 48 at a flow rate of about 200 sccm. If the second inert gas 48 it supplied with a flow rate of less than about 200 sccm, a probability of electron collisions may be reduced, and thus second plasma P2 may not be properly generated.

The power supply 50 may be connected to the sputter guns 30. The power supply 50 may supply the sputter guns 30 with the radio-frequency power 52 to generate the first plasma P1, the second plasma P2, the third plasma P3, and the fourth plasma P4. The radio-frequency power 52 may be a direct-current power, but the present inventive concepts are not limited thereto. The radio-frequency power 52 may have a pulse, and based on a frequency of the pulse, the radio-frequency power 52 may be classified into a source power and a bias power The cooling unit 60 may be disposed below the chuck 20. The cooling unit 60 may be combined with or connected to the lower portion of the chamber 10. The cooling unit 60 may cool the chuck 20 and the substrate W on the chuck 20. For example, the cooling unit 60 may cool the chuck 20 and the substrate W to a temperature less than the evaporation point (e.g., 87.3 K) of the first inert gas 46 and greater than the evaporation point (e.g., 27.7 K) of the second inert gas 48. The cooling temperature of the cooling unit 60 may be an extremely low temperature of about 50 K or less. When the cooling unit 60 cools the chuck 20 and the substrate W, the second sputter gun 34 may form the first magnetic metal layer 110 and the second magnetic metal layer 130 on the substrate W. When the cooling unit 60 cools the substrate W to an extremely low temperature, the second gas supply 44 may supply the second inert gas 48 to the chamber 10. The second inert gas 48 may deposit the first magnetic metal layer 110 and the second magnetic metal layer 130 without condensation and/or freezing at extremely low temperature. For example, when the first inert gas 46 is used to form the first magnetic metal layer 110 and the second magnetic metal layer 130, the first inert gas 46 may cause the first and second magnetic metal layers 110 and 130 to have increased deposition defects (e.g., surface roughness) resulting from the condensation at extremely low temperature. In contrast, the second inert gas 48 may reduce the deposition defects (e.g., surface roughness) of the first and second magnetic metal layers 110 and 130.

Figure 4:
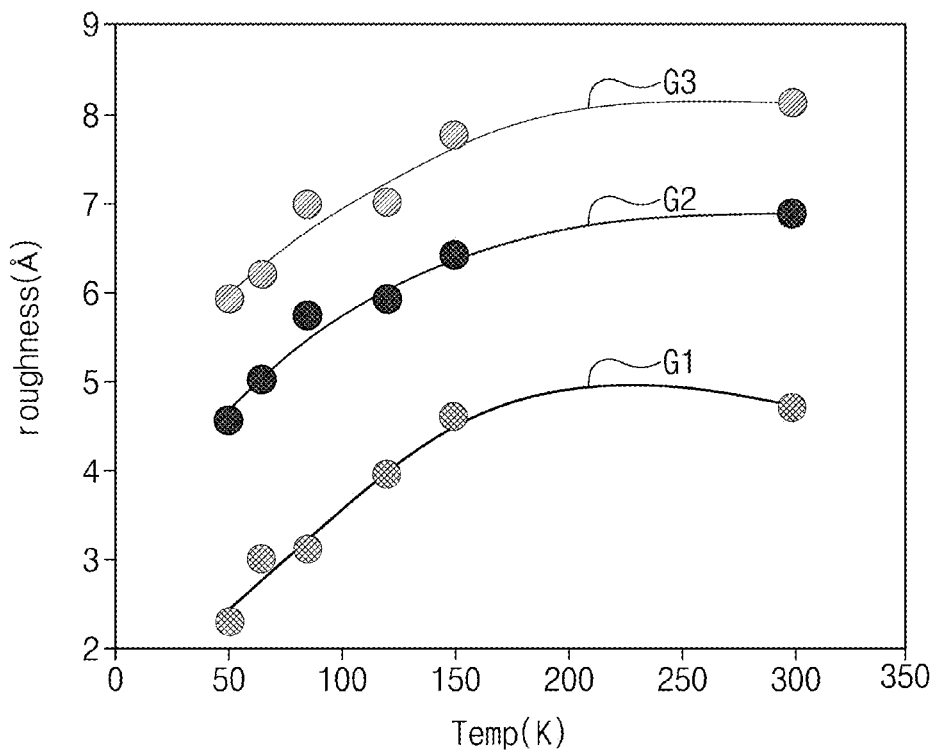
FIG. 4 illustrates a graph showing roughness of a second magnetic metal layer versus a temperature of a substrate of FIG. 1 and a flow rate of a second inert gas.

FIG. 4 shows the surface roughness of the second magnetic metal layer 130 versus the temperature of the substrate W of FIG. 1 and the flow rate of the second inert gas 48 of FIG. 1.

Referring to FIG. 4, the surface roughness of the second magnetic metal layer 130 may decrease in proportion to the flow rate of the second inert gas 48 and the cooling temperature of the substrate W.

A reduction in flow rate of the second inert gas 48 may decrease the surface roughness of the second magnetic metal layer 130. For example, a first surface roughness G1 obtained by supplying the second inert gas 48 at a low flow rate of about 200 sccm may be less than a second surface roughness G2 obtained by supplying the second inert gas 48 at an intermediate flow rate of about 500 sccm and less than a third surface roughness G3 obtained by supplying the second inert gas 48 at a high flow rate of about 1,000 sccm. The second surface roughness G2 may be obtained from the second magnetic metal layer 130 that is formed by supplying the second inert gas 48 at an intermediate flow rate of about 500 sccm. The third surface roughness G3 may be obtained from the second magnetic metal layer 130 that is formed by supplying the second inert gas 48 at a high flow rate of about 1,000 sccm.

A reduction in temperature of the substrate W may decrease the surface roughness of the second magnetic metal layer 130. For example, the first surface roughness G1, the second surface roughness G2, and the third surface roughness G3 may decrease in proportion to the cooling temperature (e.g., an amount of cooling) of the substrate W. The first surface roughness G1 may be 2.2 Å, 3 Å, and 4.5 Å based on deposition temperature (e.g., 50 K, 100 K, and 300 K) of the second magnetic metal layer 130. The second surface roughness G2 may be 4.5 Å, 5.5 Å, and 6.5 Å based on deposition temperature (e.g., 50 K, 100 K, and 300 K) of the second magnetic metal layer 130. The third surface roughness G3 may be 6.8 Å, 7.8 Å, and 8.8 Å based on deposition temperature (e.g., 50 K, 100 K, and 300 K) of the second magnetic metal layer 130. The second magnetic metal layer 130 having a thickness of about 100 Å is used to measure the surface roughness.

In an example embodiment, the cooling unit 60 may include a chiller 62, a cooling link 64, a cooling head 66, and a coolant supply 68. The chiller 62 may generate a cold thermal energy. For example, the chiller 62 may use a second coolant 74 to cool the cooling link 64, the cooling head 66, and the chuck 20. The chiller 62 may include, for example, a compressor 61 and an evaporator 63. The compressor 61 may compress and liquefy the second coolant 74. The second coolant 74 may include helium (He). The evaporator 63 may be in contact with a bottom surface of the cooling link 64. The evaporator 63 may be connected to the compressor 61. The evaporator 63 may evaporate the second coolant 74, and may use an evaporation heat of the second coolant 74 to cool the cooling link 64 to an extremely low temperature of about 50 K or less. The evaporated second coolant 74 may be directed back to the compressor 61.

The cooling link 64 may be disposed between the chiller 62 and the chuck 20. The cooling link 64 may be connected to the lower portion of the chamber 10. The shaft of the driving mechanism 22 may pass through the cooling link 64 and configured to rotate the chuck 20. The cooling link 64 may seal the driving mechanism 22 against the chamber 10. The cooling link 64 may transfer the cold thermal energy of the chiller 62 to the cooling head 66 and the chuck 20. The cooling link 64 may have, for example, a cavity 65 and a sealing member 70. The cavity 65 may be disposed on a center or a central portion of the cooling link 64. The cavity 65 may be filled with a third coolant 76. The third coolant 76 may provide the cooling head 66 with the cold thermal energy of the chiller 62 without condensation at extremely low temperature. The third coolant 76 may be the same as the first coolant 72 and the second coolant 74. For example, the third coolant 76 may include a helium (He) gas. The sealing member 70 may be disposed in the cavity 65. The sealing member 70 may be placed on an outer circumference of the driving mechanism 22 in the cavity 65. The sealing member 70 may provide the driving mechanism 22 with the first coolant 72 of the coolant supply 68. The first coolant 72 may be provided through the driving mechanism 22 to the chuck 20.

The cooling head 66 may be disposed between the cooling link 64 and the chuck 20. The cooling head 66 may provide the chuck 20 with the cold thermal energy of the chiller 62 and the cooling link 64. The cooling head 66 may be connected to the driving mechanism 22. When the driving mechanism 22 rotates, the cooling head 66 may rotate against the cooling link 64. The cooling head 66 may include a metal plate.

The coolant supply 68 may supply the first coolant 72 and the third coolant 76 to the cooling link 64 and the chuck 20. For example, the coolant supply 68 may include a first coolant supply 67 and a second coolant supply 69. The first coolant supply 67 may be connected to the cooling link 64. The first coolant supply 67 may provide the cavity 65 with the third coolant 76 to cool the cooling link 64. The second coolant supply 69 may provide the coolant hole 24 with the first coolant 72 through the driving mechanism 22 and the sealing member 70 in the cavity 65, thereby cooling the chuck 20 and the substrate W. The first coolant 72 in the coolant hole 24 may provide the substrate W with the cold thermal energy of the chiller 62 without the condensation, and thus may cool the substrate W to an extremely low temperature equal to or less than about 50 K.

The following will discuss a method of fabricating a magnetic memory device using the sputtering apparatus 100 configured as described above.

Figure 5:
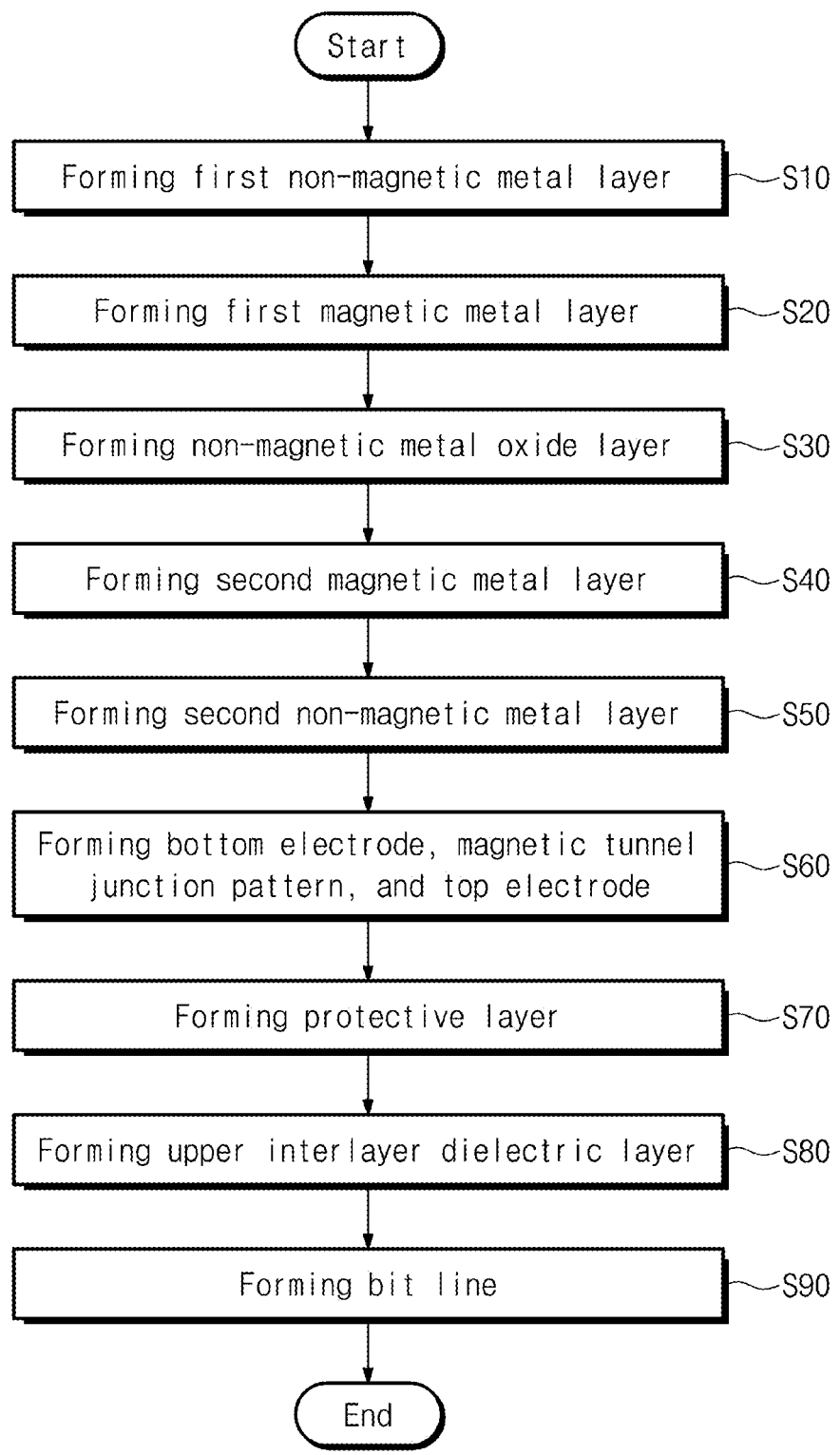
FIG. 5 illustrates a flow chart showing a method of fabricating a magnetic memory device according to an example embodiment of the present inventive concepts.

FIG. 5 shows a method of fabricating a magnetic memory device according to an example embodiment of the present inventive concepts. FIGS. 6 to 14 illustrate cross-sectional views showing a method of fabricating a magnetic memory device according to an example embodiment of the present inventive concepts.

Figure 6:
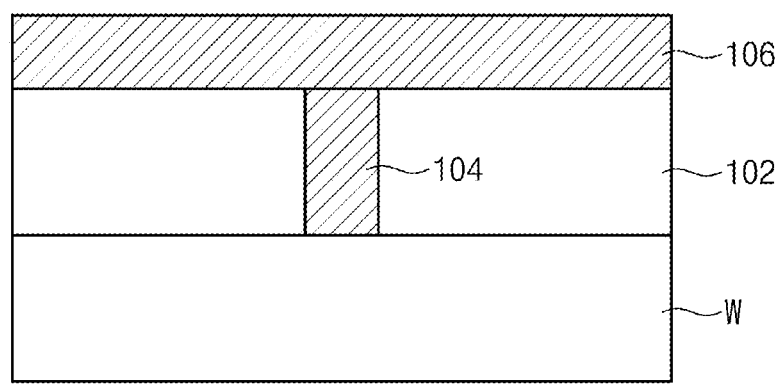
FIGS. 6 to 14 illustrate cross-sectional views showing a method of fabricating a magnetic memory device according to an example embodiment of the present inventive concepts.

Referring to FIGS. 5 and 6, the first sputter gun 32 may use a room temperature sputtering method or a high temperature sputtering method to form a first non-magnetic metal layer 106 on the substrate W (S10). The room temperature sputtering method refers to a sputtering method of forming a layer while keeping the substrate W at or above a room temperature. The high temperature sputtering method refers to a sputtering method of forming a layer while heating the substrate W to a temperature higher than the room temperature. For example, the first non-magnetic metal layer 106 may include ruthenium (Ru). The substrate W may include a silicon wafer. A lower interlayer dielectric layer 102 and a contact plug 104 may be provided on the substrate W. The lower interlayer dielectric layer 102 may be formed between the substrate W and the first non-magnetic metal layer 106. The lower interlayer dielectric layer 102 may include silicon oxide. The contact plug 104 may penetrate the lower interlayer dielectric layer 102, and may connect the first non-magnetic metal layer 106 to the substrate W. Although not shown, the substrate W may have a switching element for a thin film transistor and a word line connected to the switching element. The thin film transistor may include a source electrode, a drain electrode, and a gate electrode. For example, the drain electrode may be connected to the contact plug 104. The gate electrode may be connected to the word line.

Figure 7:
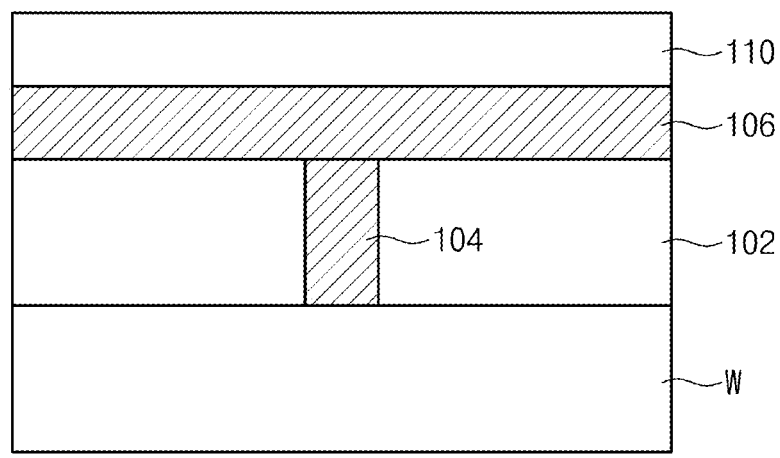

Referring to FIGS. 5 and 7, the second sputter gun 34 may use an extremely low temperature sputtering method to form a first magnetic metal layer 110 on the first non-magnetic metal layer 106 (S20). The extremely low temperature sputtering method refers to a sputtering method for forming a layer while cooling the substrate W to a temperature of 50K or less. For example, the first magnetic metal layer 110 may include a ferromagnetic metal (e.g., nickel (Ni), cobalt (Co), or iron (Fe)) and an impurity (e.g., boron (B)) mixed in the ferromagnetic metal. The first magnetic metal layer 110 may include CoFeB, but the present inventive concepts are not limited thereto. The cooling unit 60 may cool the substrate W to an extremely low temperature equal to or less than about 50 K to form the first magnetic metal layer 110. The first magnetic metal layer 110 may have a thickness of about 30 Å to about 300 Å. When the first magnetic metal layer 110 has a thickness of about 30 Å or less, the first magnetic metal layer 110 may have a surface roughness of about 2 Å or less. In some example embodiments, a room temperature sputtering method or a high temperature sputtering method may be used to form the first magnetic metal layer 110 at room temperature or a temperature greater than room temperature.

Figure 8:
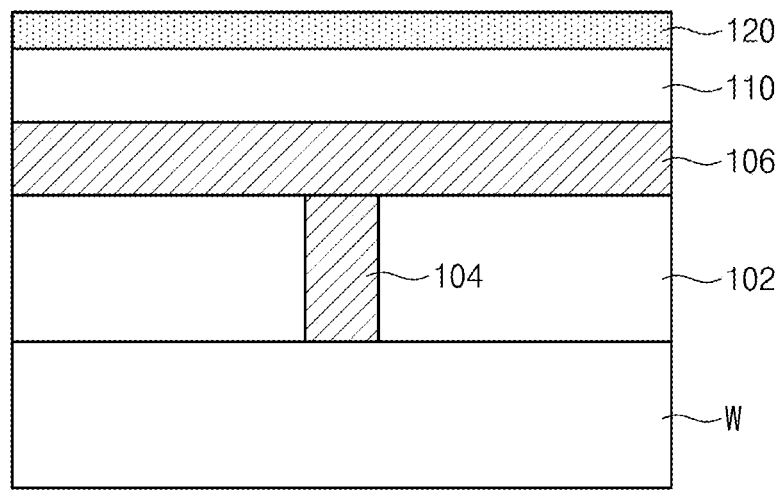

Referring to FIGS. 5 and 8, the third sputter gun 36 may use a room temperature sputtering method or a high temperature sputtering method to form a non-magnetic metal oxide layer 120 on the first magnetic metal layer 110 (S30). The non-magnetic metal oxide layer 120 may be formed at either room temperature or a temperature greater than room temperature without cryogenic condensation of the cooling unit 60 The non-magnetic metal oxide layer 120 may have a thickness of, for example, about 20 Å to about 200 Å. The non-magnetic metal oxide layer 120 may include magnesium oxide (MgO), but the present inventive concepts are not limited thereto.

Figure 9:
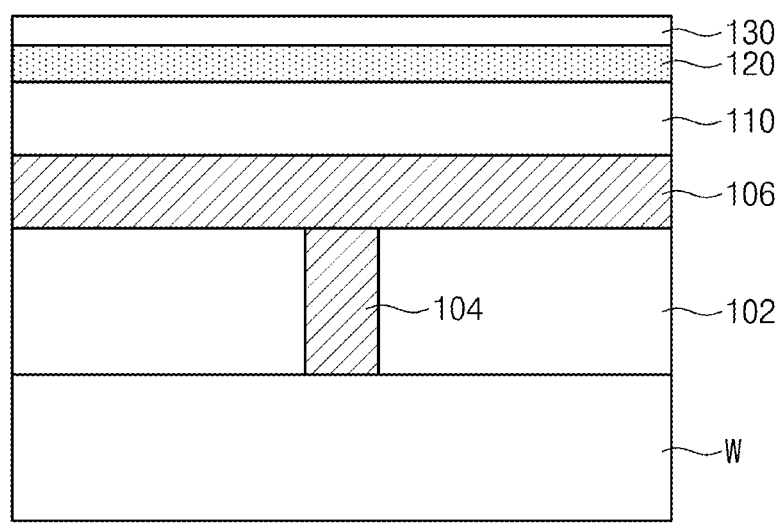

Referring to FIGS. 5 and 9, the second sputter gun 34 may use an extremely low temperature sputtering method to form a second magnetic metal layer 130 on the non-magnetic metal oxide layer 120 (S40). The second magnetic metal layer 130 may be of the same kind as that of the first magnetic metal layer 110. For example, the second magnetic metal layer 130 may include a ferromagnetic metal (e.g., nickel (Ni), cobalt (Co), or iron (Fe)) and an impurity (e.g., boron (B)) mixed in the ferromagnetic metal. The second magnetic metal layer 130 may include CoFeB.

Figure 15:
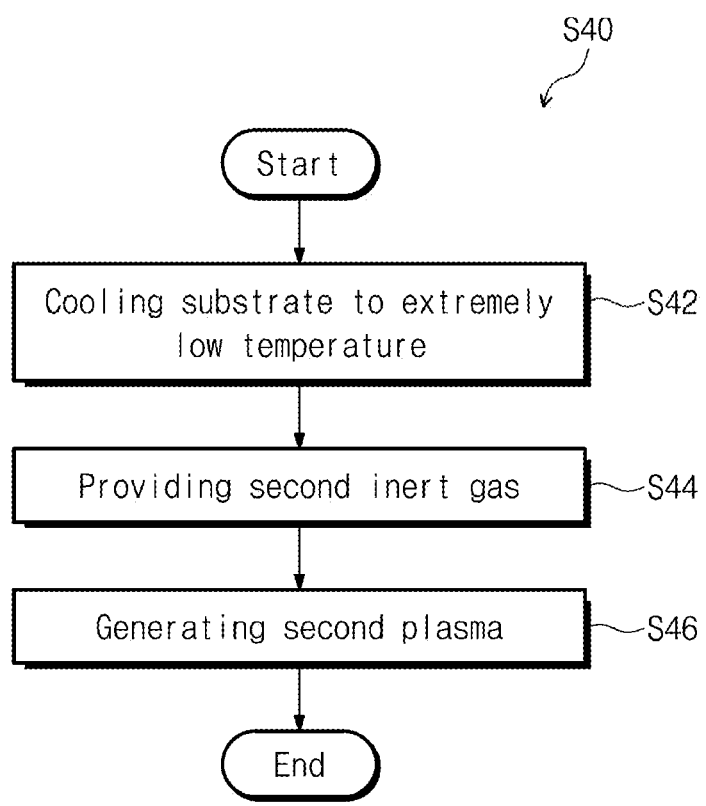
FIG. 15 illustrates a flow chart showing an example of a step of forming a second magnetic metal layer depicted in FIG. 9.

FIG. 15 shows an example of the step S40 of forming the second magnetic metal layer 130 depicted in FIG. 9.

Referring to FIGS. 2, 9, and 15, the cooling unit 60 may cool the substrate W to an extremely low temperature (S42). The cooling unit 60 may cool the substrate W to an extremely low temperature equal to or less than about 50 K.

The second gas supply 44 may provide the chamber 10 with the second inert gas 48 through the nozzle hole 348 (S44). The second gas supply 44 may provide the chamber 10 with the second inert gas 48 at a flow rate of about 200 sccm.

The power supply 50 may supply the second sputter gun 34 with the radio-frequency power 52 to generate the second plasma P2 (S46). The radio-frequency power 52 may be about 100 W to about 200 W. The second plasma P2 and the cryogenic substrate W may decrease a surface roughness of the second magnetic metal layer 130. Further, the cryogenic substrate W may also decrease a surface energy of the second magnetic metal layer 130. The second magnetic metal layer 130 may be formed thinner than the first magnetic metal layer 110. For example, the second magnetic metal layer 130 may be formed to have a thickness of about 10 Å or less.

Figure 16:
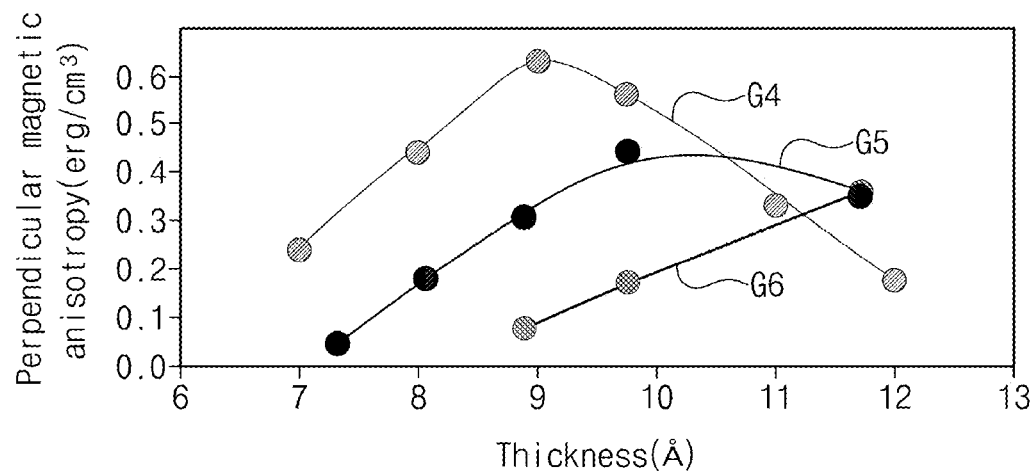
FIG. 16 illustrates a graph showing perpendicular magnetic anisotropy versus a deposition temperature and a thickness of a second magnetic metal layer depicted in FIG. 9.

FIG. 16 shows perpendicular magnetic anisotropy versus a deposition temperature and a thickness of the second magnetic metal layer 130 depicted in FIG. 9.

Referring to FIG. 16, the second magnetic metal layer 130 having a thickness of about 10 Å or less may have perpendicular magnetic anisotropy, which is inversely proportional to a deposition temperature of the second magnetic metal layer 130. For the second magnetic metal layer 130, a first perpendicular magnetic anisotropy G4 obtained at an extremely low temperature equal to or less than about 50 K may be greater than a second perpendicular magnetic anisotropy G5 obtained at a low temperature equal to or less than about 150 K or a third perpendicular magnetic anisotropy G6 obtained at room temperature of about 300 K. The second perpendicular magnetic anisotropy G5 may be obtained from the second magnetic metal layer 130 that is deposited at a low temperature of about 150 K. The third perpendicular magnetic anisotropy G6 may be obtained from the second magnetic metal layer 130 that is deposited at room temperature of about 300 K. When the second magnetic metal layer 130 has a thickness of about 9 Å, the first perpendicular magnetic anisotropy G4 may have a peak of about 0.6 erg/cm$^3$. For example, a maximum perpendicular anisotropy may be given to the second magnetic metal layer 130 that is formed as thick as about 9 Å at an extremely low temperature of about 50 K. The second magnetic metal layer 130 having a thickness of about 10 Å or less may have a surface roughness of about 2 Å or less.

Figure 10:
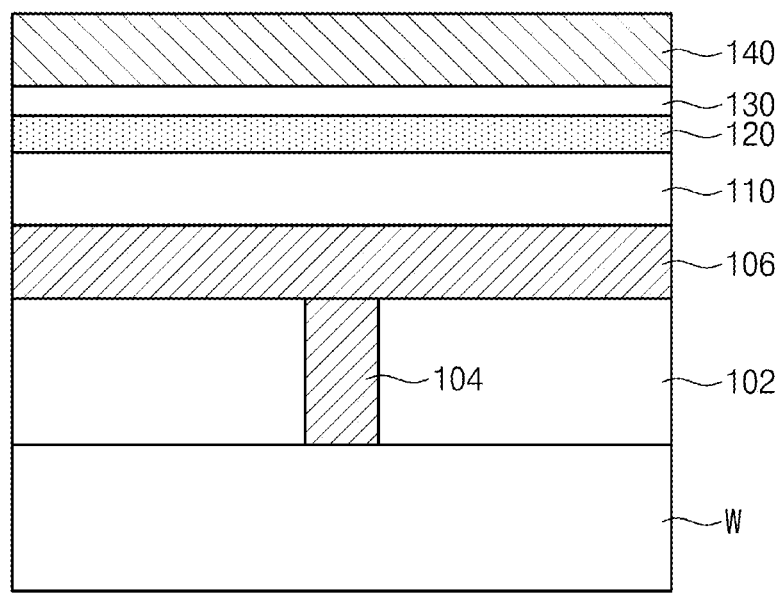

Referring to FIGS. 5 and 10, the fourth sputter gun 38 may use a room temperature sputtering method or a high temperature sputtering method to form a second non-magnetic metal layer 140 on the second magnetic metal layer 130 (S50). The second non-magnetic metal layer 140 may be formed at room temperature or high temperature. The second non-magnetic metal layer 140 may include a metal (e.g., gold (Au), silver (Ag), tungsten (W), or aluminum (Al)).

Figure 11:
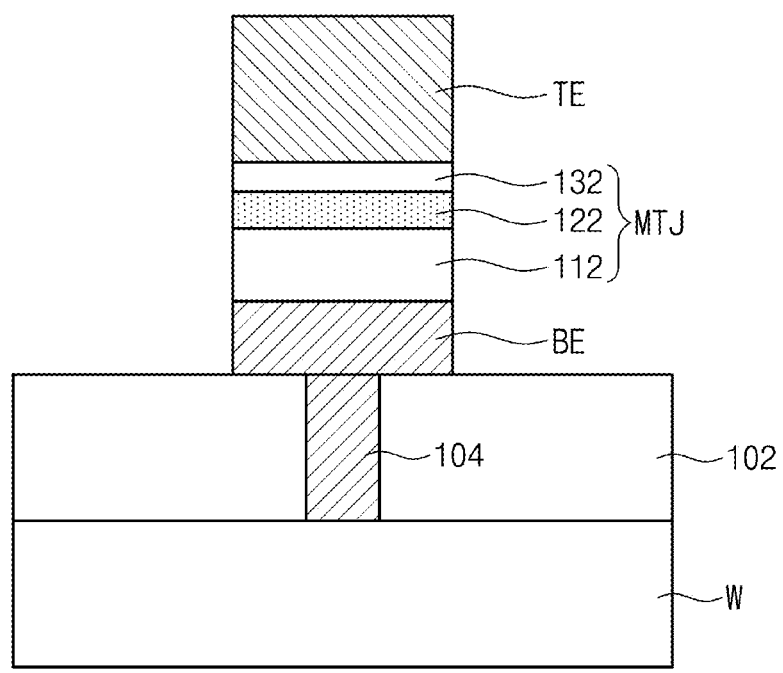

Referring to FIGS. 5 and 11, a photolithography apparatus and an etching apparatus may partially remove the first non-magnetic metal layer 106, the first magnetic metal layer 110, the non-magnetic metal oxide layer 120, the second magnetic metal layer 130, and the second non-magnetic metal layer 140 to form a bottom electrode BE, a magnetic tunnel junction pattern MTJ, and a top electrode TE (S60). The magnetic tunnel junction pattern MTJ may be formed between the bottom electrode BE and the top electrode TE. For example, the magnetic tunnel junction pattern MTJ may include a first magnetic metal pattern 112, a non-magnetic metal oxide pattern 122, and a second magnetic metal pattern 132. The first magnetic metal pattern 112 may be a pinned layer whose magnetization direction is fixed. The non-magnetic metal oxide pattern 122 may be a tunnel barrier layer. The second magnetic metal pattern 132 may be a free layer whose magnetization direction is changeable.

Figure 17:
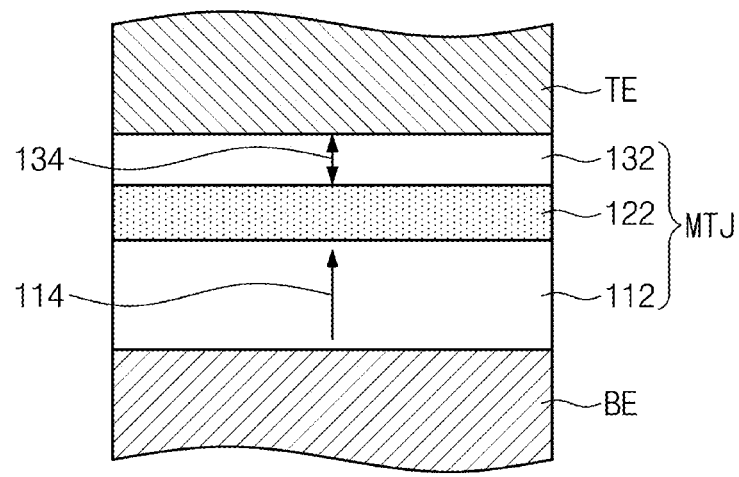
FIG. 17 illustrates a cross-sectional view showing an example of first perpendicular magnetic field in a first magnetic metal pattern and a second perpendicular magnetic field in a second magnetic pattern depicted in FIG. 11.

FIG. 17 shows an example of a first perpendicular magnetic field 114 in the first magnetic metal pattern 112 and a second perpendicular magnetic field 134 in the second magnetic metal pattern 132.

Referring to FIG. 17, the first magnetic metal pattern 112 and the second magnetic metal pattern 132 may have the first perpendicular magnetic field 114 and the second perpendicular magnetic field 134, respectively. The first perpendicular magnetic field 114 and the second perpendicular magnetic field 134 may be oriented substantially orthogonal to an interface between the first magnetic metal pattern 112 and the second magnetic metal pattern 132. The first perpendicular magnetic field 114 may be formed in the first magnetic metal pattern 112. The first perpendicular magnetic field 114 may have a direction that is fixed regardless of external current. The second perpendicular magnetic field 134 may be formed in the second magnetic metal pattern 132. The second perpendicular magnetic field 134 may be used as magnetic recording information. The second perpendicular magnetic field 134 may change its direction based on a write-current direction between the bottom electrode BE and the top electrode TE. The direction of the second perpendicular magnetic field 134 may change a read current between the bottom electrode BE and the top electrode TE. When the direction of the second perpendicular magnetic field 134 is directed downwardly, the read current may increase. When the direction of the second perpendicular magnetic field 134 is directed upwardly, the read current may decrease. A difference in energy of the second perpendicular magnetic field 134 may be represented or explained by perpendicular magnetic anisotropy.

Referring to FIGS. 9, 11, and 16, when the second magnetic metal layer 130 (or the second magnetic metal layer 130) is formed to have a thickness of about 8 Å to about 10 Å, the first perpendicular magnetic anisotropy G4 may be greater than the second perpendicular magnetic anisotropy G5 and the third perpendicular magnetic anisotropy G6. The first perpendicular magnetic anisotropy G4 may be obtained from the second magnetic metal layer 130 that is deposited at an extremely low temperature of about 50 K. When the second magnetic metal layer 130 is formed as thick as about 9 Å at an extremely low temperature of about 50 K, a maximum perpendicular anisotropy may be given to the second perpendicular magnetic field 134 in the second magnetic metal pattern 132.

Figure 12:
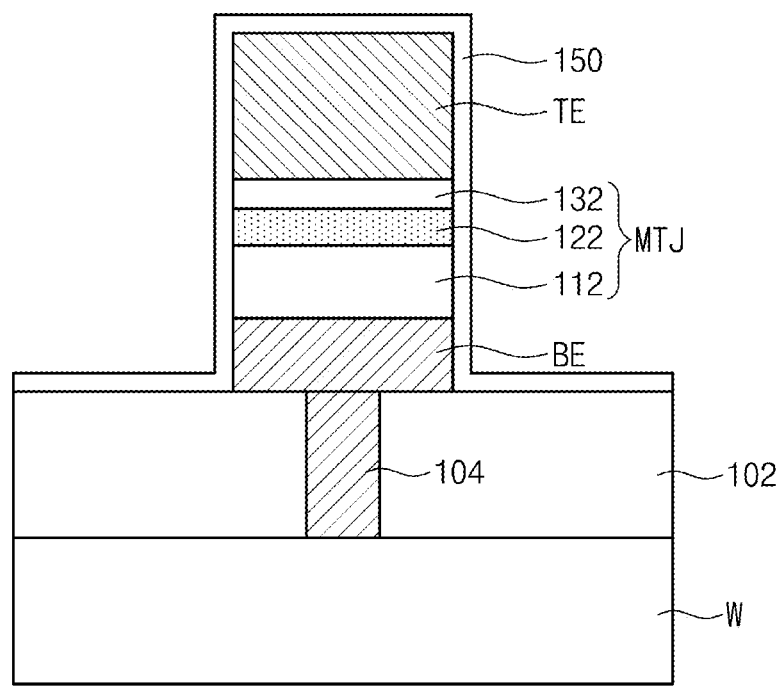

Referring to FIGS. 5 and 12, a thin-layer deposition apparatus (not shown) may form a protective layer 150 on the magnetic tunnel junction pattern MTJ and the substrate W (S70). The protective layer 150 may include one or more of metal oxide (e.g., TiO$_2$) and metal nitride (e.g., TiN) that are formed by a chemical vapor deposition method. The protective layer 150 may be conformally formed.

Figure 13:
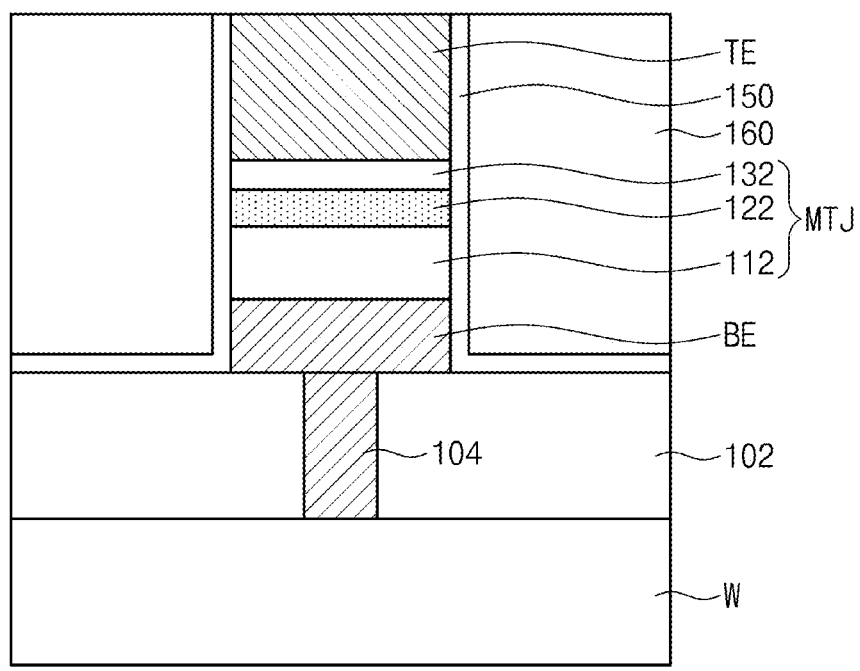

Referring to FIGS. 5 and 13, a thin-layer deposition apparatus (not shown) may form an upper interlayer dielectric layer 160 on the protective layer 150 (S80). The upper interlayer dielectric layer 160 may include, for example, silicon oxide that is formed by a chemical vapor deposition method. A chemical mechanical polishing method may planarize the upper interlayer dielectric layer 160 to externally expose a top surface of the top electrode TE.

Figure 14:
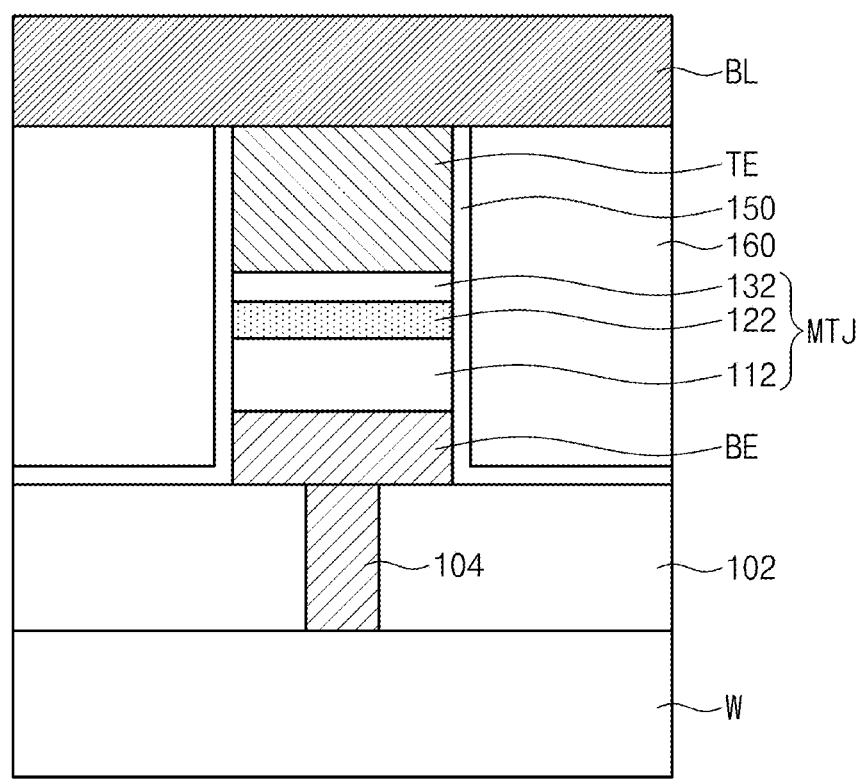

Referring to FIGS. 5 and 14, a thin-layer deposition apparatus, a lithography apparatus, and an etching apparatus may form a bit line BL on the upper interlayer dielectric layer 160 and the top electrode TE (S90). The thin-layer deposition apparatus may use a sputtering method or a chemical vapor deposition method to form a metal layer on the upper interlayer dielectric layer 160 and the top electrode TE. The lithography apparatus may form a photoresist pattern on the metal layer. The etching apparatus may use the photoresist pattern as an etching mask to partially remove the metal layer to form the bit line BL.

As discussed above, a sputtering apparatus according to some example embodiments of the present inventive concepts may use a cooling unit that cools a chuck and a substrate on the chuck to an extremely low temperature to reduce a surface roughness of a magnetic metal layer formed on the substrate and to increase perpendicular magnetic anisotropy.

Although the present inventive concepts have been described in connection with some example embodiments illustrated in the accompanying drawings, it will be understood to those skilled in the art that various changes and modifications may be made without departing from the technical spirit and essential feature of the present inventive concepts. It therefore will be understood that the example embodiments described above are just illustrative but not limitative in all aspects.

What is claimed is:

1. A method of fabricating a magnetic memory device, the method comprising:
forming a first magnetic metal layer on a substrate;
forming a non-magnetic metal oxide layer on the first magnetic metal layer using a first sputtering process to keep the substrate at or above a room temperature; and
forming a second magnetic metal layer on the non-magnetic metal oxide layer using a second sputtering process to cool the substrate to a temperature of 50K or less,
wherein the first sputtering process uses a first inert gas having a first evaporation point and the second sputtering process uses a second inert gas having a second evaporation point lower than the first evaporation point,
wherein the first inert gas is provided in a chamber, and
wherein the second sputtering process uses at least one of a plurality of sputter guns having a nozzle hole configured to spray the second inert gas in the chamber.

2. The method of claim 1, wherein the forming the second magnetic metal layer includes:
cooling the substrate to a temperature equal to or less than 50 K; and
providing the second inert gas on the substrate.

3. The method of claim 2, wherein the second inert gas includes a neon gas.

4. The method of claim 1, wherein the second magnetic metal layer is formed to have a thickness of 8 Å to 10 Å and a surface roughness of 2 Å or less.

5. The method of claim 1, wherein the first magnetic metal layer is formed using a third sputtering process to cool the substrate to a temperature of 50K or less.

6. The method of claim 1, wherein the first inert gas is supplied at a first flow rate and the second inert gas is supplied at a second first flow rate greater than the first flow rate.

7. The method of claim 1, wherein the first inert gas is supplied to the chamber by a first gas supply connected to an inner wall of the chamber and the second inert gas is supplied to the chamber by a second gas supply connected to the nozzle hole defined at the at least one of the plurality of sputter guns, which is disposed above the substrate in the chamber.

* * * * *